(12) United States Patent
Liu et al.

(10) Patent No.: US 8,900,932 B2
(45) Date of Patent: *Dec. 2, 2014

(54) THERMAL ENHANCED PACKAGE

(75) Inventors: Chenglin Liu, San Jose, CA (US);
Shiann-Ming Liou, Campbell, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/613,886

(22) Filed: Sep. 13, 2012

(65) Prior Publication Data

US 2013/0011964 A1    Jan. 10, 2013

Related U.S. Application Data

(60) Continuation of application No. 12/496,379, filed on Jul. 1, 2009, now Pat. No. 8,357,568, which is a division of application No. 11/471,057, filed on Jun. 19, 2006, now Pat. No. 7,675,157.

(60) Provisional application No. 60/788,993, filed on Apr. 3, 2006, provisional application No. 60/763,609, filed on Jan. 30, 2006.

(51) Int. Cl.
| H01L 29/72 | (2006.01) |
| H01L 23/00 | (2006.01) |
| H01L 23/367 | (2006.01) |
| H01L 23/538 | (2006.01) |
| H01L 23/31 | (2006.01) |

(52) U.S. Cl.
CPC ............ *H01L 23/3128* (2013.01); *H01L 24/19* (2013.01); *H01L 2924/01074* (2013.01); *H01L 2924/14* (2013.01); *H01L 2224/92224* (2013.01); *H01L 2924/01051* (2013.01); *H01L 2924/19041* (2013.01); *H01L 23/367* (2013.01); *H01L 2924/014* (2013.01); *H01L 2924/01004* (2013.01); *H01L 2924/01033* (2013.01); *H01L 2924/01029* (2013.01); *H01L 2924/15311* (2013.01); *H01L 2924/01023* (2013.01); *H01L 2924/01006* (2013.01); *H01L 23/5389* (2013.01); *H01L 2924/01079* (2013.01)
USPC ........... 438/127; 438/108; 438/109; 438/124; 438/126

(58) Field of Classification Search
CPC ............................................. H01L 2924/01079
USPC .................................... 438/108, 10, 124, 126
See application file for complete search history.

(56) References Cited

U.S. PATENT DOCUMENTS 5,216,278 A    6/1993   Lin et al.
5,291,062 A    3/1994   Higgins, III
(Continued)

OTHER PUBLICATIONS

PCT International Search Report; Date of Mailing: Apr. 2, 2008; (2 pgs).

(Continued)

*Primary Examiner* — Edward Wojciechowicz

(57) ABSTRACT

A method of manufacturing an integrated circuit package. The method includes attaching a first surface of a semiconductor die to a thermally and/or electrically conductive substrate, forming a plurality of die connectors on a second surface of the semiconductor die, and encapsulating the semiconductor die and the plurality of die connectors in an encapsulant material. The method also includes removing a portion of the encapsulant material to expose one or more of the plurality of die connectors, thereby forming a routing surface. The method further includes forming a plurality of conductive traces on the routing surface. Each of the plurality of conductive traces is characterized by a first portion in electrical communication with one of the plurality of die connectors and a second portion in electrical communication with a package connector.

21 Claims, 13 Drawing Sheets

(56) References Cited

U.S. PATENT DOCUMENTS

| | | |
|---|---|---|
| 6,060,778 A | 5/2000 | Jeong et al. |
| 6,429,096 B1 | 8/2002 | Yanagida |
| 6,833,609 B1 | 12/2004 | Fusaro et al. |
| 7,365,423 B2 | 4/2008 | Pavier |
| 7,417,325 B2 | 8/2008 | Farnsworth et al. |
| 8,357,568 B2 * | 1/2013 | Liu et al. .................. 438/127 |
| 2002/0185750 A1 | 12/2002 | Khan et al. |
| 2003/0102523 A1 | 6/2003 | Li et al. |
| 2005/0157477 A1 | 7/2005 | Kuramochi et al. |
| 2012/0241956 A1 * | 9/2012 | Bolken et al. .................. 257/738 |

OTHER PUBLICATIONS

State Intellectual Property Office of the People's Republic of China; Text of the First Office Action; Application No. 200780012013.9; dated Feb. 12, 2010; (1 pg).

Taiwan Intellectual Property Office Text of the First Office Action for Application No. 096103334 dated Mar. 11, 2010, including English translation; (10 pgs).

* cited by examiner

THERMAL ENHANCED PACKAGE

CROSS-REFERENCES TO RELATED APPLICATIONS

This application is a continuation of U.S. patent application Ser. No. 12/496,379, filed Jul. 1, 2009, which is a divisional of U.S. patent application Ser. No. 11/471,057, filed Jun. 19, 2006, now U.S. Pat. No. 7,675,157, which claims the benefit under 35 USC 119(e) of U.S. Provisional Application No. 60/763,609, entitled "Thermal Enhanced Package," filed on Jan. 30, 2006, and U.S. Provisional Application No. 60/788,993, entitled "Thermal Enhanced Package," filed on Apr. 3, 2006, the entirety of U.S. patent application Ser. No. 11/471,057, now U.S. Pat. No. 7,675,157, U.S. Provisional Application No. 60/763,609 and U.S. Provisional Application No. 60/788,993 are incorporated by reference herein.

BACKGROUND OF THE INVENTION

The present invention relates generally to integrated circuit packages. More particularly, the invention provides methods and systems for integrated circuit packages with thermally enhanced performance. Merely by way of example, the invention has been applied to an integrated circuit package with one or more semiconductor dies mounted on a thermally and/or electrically conductive substrate and encapsulated in a dielectric material. But it would be recognized that the invention has a much broader range of applicability.

Many modern integrated circuits (ICs) are characterized by high thermal loads as a result of the industry requirements for small footprint and high performance. As thermal loading and package density increases, conventional integrated circuit (IC) packages fail to provide the thermal and electrical performance needed for high performance ICs. Thus, there is a need in the art for methods and systems adapted to provide integrated circuit packages with enhanced thermal performance.

SUMMARY OF THE INVENTION

According to embodiments of the present invention, techniques and systems related to integrated circuit packages are provided. More particularly, the invention provides methods and systems for integrated circuit packages with thermally enhanced performance. Merely by way of example, the invention has been applied to an integrated circuit package with one or more semiconductor dies mounted on a thermally and/or electrically conductive substrate and encapsulated in a dielectric material. But it would be recognized that the invention has a much broader range of applicability.

According to an embodiment of the present invention, a method of manufacturing an integrated circuit package is provided. The method includes attaching a first surface of a semiconductor die to a thermally and/or electrically conductive substrate, forming a number of die connectors on a second surface of the semiconductor die, and encapsulating the semiconductor die and the number of die connectors in an encapsulant material. The method also includes removing a portion of the encapsulant material to expose one or more of the number of die connectors, thereby forming a routing surface. The method further includes forming a number of conductive traces on the routing surface. Each of the number of conductive traces is characterized by a first portion in electrical communication with one of the number of die connectors and a second portion in electrical communication with a package connector. In one embodiment, an insulating layer is formed over the routing surface and a number of second-level conductive traces are formed on the insulating layer to form an integrated circuit package with multi-layer routing.

According to another embodiment of the present invention, a thermally enhanced integrated circuit package is provided. The thermally enhanced integrated circuit package includes a thermally and/or electrically conductive substrate, a die attach material formed on the thermally and/or electrically conductive substrate, and a semiconductor die having a first surface, a number of side surfaces, and a second surface opposing the first surface. The first surface is adjacent to the die attach material. The thermally enhanced integrated circuit package also includes a number of die connectors in electrical communication with a number of die pads provided on the second surface of the semiconductor die and an encapsulant layer characterized by a first encapsulant surface positioned adjacent to the thermally and/or electrically conductive substrate and a second encapsulant surface opposing the first surface. The encapsulant layer surrounds the number of side surfaces of the semiconductor die and is positioned over a first portion of the second surface of the semiconductor die. The thermally enhanced integrated circuit package further includes a routing layer formed on the second encapsulant surface of the encapsulant layer.

According to an alternative embodiment of the present invention, an integrated circuit package is provided. The integrated circuit package includes a semiconductor die including a first surface attached to a thermally and/or electrically conductive substrate and a second surface opposing the first surface. The integrated circuit package also includes a number of die connectors formed on the second surface of the semiconductor die, an encapsulant material encapsulating the semiconductor die and a portion of the number of die connectors. A routing surface of the encapsulating material includes exposed portions of the number of die connectors. The integrated circuit package further includes a number of conductive traces formed on the routing surface, wherein each of the number of conductive traces is characterized by a first portion in electrical communication with one of the number of die connectors and a second portion in electrical communication with a package connector. In one embodiment, the integrated circuit package additionally includes an insulating layer formed over the routing surface and a number of second-level conductive traces formed on the insulating layer, thereby forming an integrated circuit package with multi-layer routing.

According to another alternative embodiment of the present invention, a method of fabricating a thermally enhanced integrated circuit package is provided. The method includes forming a die attach material layer on a surface of a thermally and/or electrically conductive substrate and mounting a first surface of a semiconductor die to the die attach material layer. The semiconductor die is defined by a number of side surfaces and a second surface opposing the first surface. The method also includes forming a number of die connectors in electrical communication with a number of die pads provided on the second surface of the semiconductor die and forming an encapsulant layer characterized by a first encapsulant surface positioned adjacent to the thermally and/or electrically conductive substrate and a second encapsulant surface opposing the first encapsulant surface. The encapsulant layer surrounds the number of side surfaces of the semiconductor die and is positioned over a first portion of the second surface of the semiconductor die. The method further includes forming a routing layer on the second encapsulant surface.

According to a specific embodiment of the present invention, an integrated circuit package is provided. The integrated circuit package includes means for supporting a first surface of a semiconductor die, means for providing electrical signals to a second surface of the semiconductor die, and means for encapsulating the semiconductor die. The integrated circuit package also includes means for routing electrical signals from the second surface of the semiconductor die to a package connector.

According to another specific embodiment of the present invention a thermally enhanced integrated circuit package is provided. The thermally enhanced integrated circuit package includes means for supporting a semiconductor die characterized by a first surface, a second surface opposing the first surface and a number of side surfaces extending from the first surface to the second surface. The thermally enhanced integrated circuit package also includes means for electrically coupling the second surface of the semiconductor die to a conductive trace and means for encapsulating the semiconductor die.

Many benefits are achieved by way of the present invention over conventional techniques. For example, embodiments of the present invention provide an integrated circuit package with improved heat dissipation properties compared to conventional packages. Moreover, some embodiments provide for the addition of passive components to the integrated circuit package. Depending upon the embodiment, one or more of these benefits, as well as other benefits, may be achieved. These and other benefits will be described in more detail throughout the present specification and more particularly below in conjunction with the following drawings.

DETAILED DESCRIPTION OF SPECIFIC EMBODIMENTS

Figure 1:
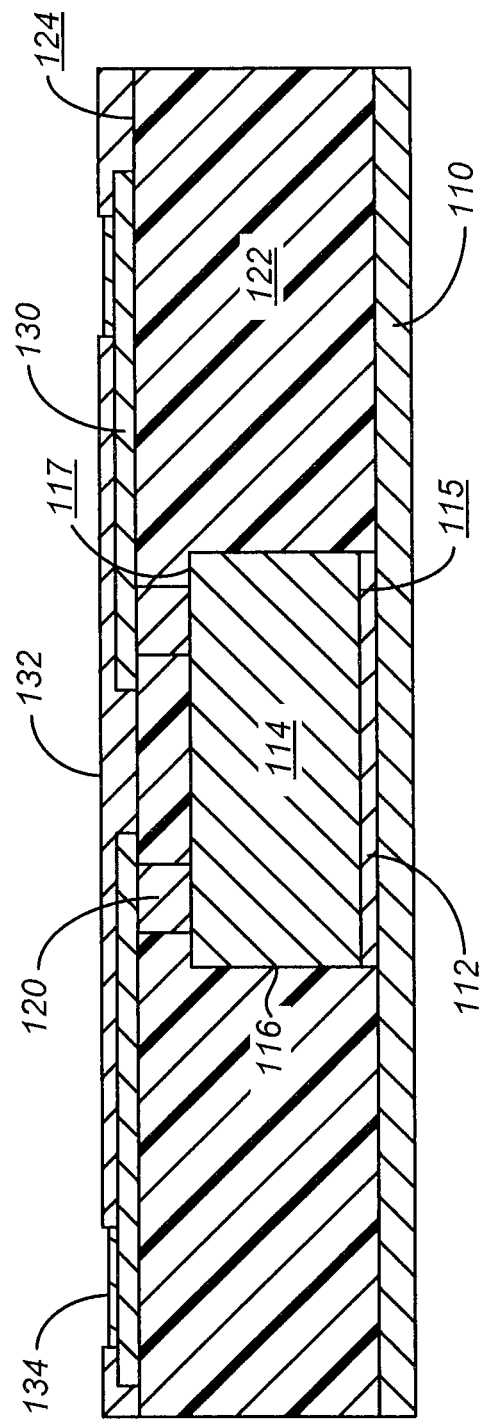
FIG. 1 is a simplified cross-sectional view of an integrated circuit package according to an embodiment of the present invention.

FIG. 1 is a simplified cross-sectional view of an integrated circuit package according to an embodiment of the present invention. As illustrated in FIG. 1, a semiconductor die 114 is attached to a thermally and/or electrically conductive substrate 110, for example, a metal substrate, by a die attach material 112. The thermally and/or electrically conductive substrate 110 may be fabricated from copper or other metals characterized by predetermined thermal conductivity and mechanical rigidity. Thermally and/or electrically conductive substrate 110 serves as a heat spreader to improve thermal dissipation, among other functions. Additionally, the thermally and/or electrically conductive substrate provides electrical functionality, such as serving as a ground plane. Die attach material 112 may be one of a variety of thermally conductive adhesive materials. Generally, die attach material 112 is characterized by a high adhesive strength, high thermal conductivity, and a coefficient of thermal expansion (CTE) close to that of the thermally and/or electrically conductive substrate 110 and the semiconductor die 114.

The semiconductor die 114 has a bonding surface 115 which is coupled to the thermally and/or electrically conductive substrate 110 through the die attach material 112, a top surface 117 opposing the bonding surface 115, and a plurality of sides 116. In FIG. 1, the sides are illustrated as vertical sides extending between the bonding surface and the top surface. The semiconductor die includes one or more integrated circuits and is also referred to as an integrated circuit (IC) die. Generally, such a semiconductor wafer containing a number of IC dies is copper, gold, or solder bumped before backgrinding and singulation is performed to form bumped IC dies.

The top surface 117 includes a plurality of die pads (not shown) that are electrically coupled to various integrated circuit elements on the semiconductor die. In order to provide electrical connectivity to/from the semiconductor die, a plurality of die connectors 120 are formed on the die pads. The die connectors 120 are formed using any one of a variety of electrically conductive materials, for example, solder bumps, gold bumps, and the like. The die connectors 120 are formed at the wafer level. Die singulation or sawing is performed to separate the individual dies. Subsequently, the dies are attached on the thermally and/or electrically conductive substrate 110 as shown in FIG. 1. One of ordinary skill in the art would recognize many variations, modifications, and alternatives. Although the die connectors 120 are illustrated as having a rectangular cross-section in the cross-sectional view illustrated in FIG. 1, this is not required by the present invention. Die connectors of other shapes, including spherical, cylindrical, and the like, may be used.

As described more fully below in reference to FIG. 3, an encapsulant material 122, also referred to herein as a dielectric material, is formed in contact with the thermally and/or electrically conductive substrate 110 and surrounding the semiconductor die 114. The encapsulant material 122 may be one of a number of epoxy resins and the like. In the embodiment illustrated in FIG. 1, the encapsulant material 122 surrounds the sides of the die connectors 120, as well as the portions of the top surface 117 of the semiconductor die 114 other than the portions in contact with the die connectors 120. Accordingly, although not illustrated in FIG. 1, the side portions of the die connectors 120, as well as five sides of the semiconductor die 114, are surrounded by the encapsulant material 122.

After encapsulation of the semiconductor die and the die connectors, the encapsulant material above the surface denoted by reference number 124 is removed to form a routing surface 124. In an embodiment, the encapsulant material is planarized using a grinding process to form the routing surface. Various thinning processes, such as grinding, lapping, and the like, may be used to form the planar surface and expose a top portion of the die connectors. The thinning process is terminated after an upper surface of the die connectors is exposed, but prior to reaching the top surface 117 of the semiconductor die. Thus, the die connectors 120 are surrounded on their lateral side surfaces by the encapsulant material 122, which spans the lateral gaps between die connectors 120. In the region above the semiconductor die 114, the encapsulant material 122 electrically insulates the top surface of the semiconductor die, spanning the distance from the top surface 117 to the routing surface 124. In an embodiment, a planar surface comprising dielectric material portions and die bump portions is formed after the grinding process. In a top view, the die bump portions appear as islands in the dielectric or encapsulant material. This planar routing surface is illustrated by reference number 124 in FIG. 1.

A number of electrically conductive traces 130 are patterned on the routing surface 124 to provide electrical interconnections between the die connectors 120 and the packaging connectors 134, for example, package pins. In an embodiment, the electrically conductive traces 130 are fabricated using copper patterning processes. Patterning to form the electrically conductive traces is performed using methods known to one of skill in the art, including photolithography, pattern plating, sputtering, the deposition of oxides or other mask materials, and etching processes. Alternatively, dual damascene processes are used as will be evident to one of skill in the art. Thus, the combination of the die connectors and the electrically conductive traces provide for an electrical path for signals used by or generated by the integrated circuits present in the semiconductor die. As illustrated in FIG. 1, a single routing layer including a single layer of electrically conductive traces 130 is provided in some embodiments. However, the present invention is not limited to the use of a single routing layer. In other embodiments, multiple routing layers, electrically isolated from one another, are provided. Accordingly, multi-level interconnections are possible as appropriate to a particular application, for example, high density IC packages. One of ordinary skill in the art would recognize many variations, modifications, and alternatives.

After definition of the conductive traces 130, the upper surface of the package is plated with a plating layer 132, illustrated in FIG. 1 as a solder mask. A benefit provided by the plating layer 132 is additional heat spreading and dissipation as well as protection of the conductive traces 130. Additionally, the solder mask or plating layer 132 defines package connector lands and protects the electrically conductive traces 130 at the package connector side of the package. Moreover, the solder mask or plating layer 132 defines component (e.g., chip capacitors) connection lands at the side of the package opposite the package connector side (i.e., the lower surface of thermally and/or electrically conductive substrate 110). The plating layer may be formed using a metal layer that enables the top surface of the package to be soldered to other portions of a package, such as to a land grid array (LGA) with or without solder bumps, a solder ball attached ball grid array (BGA), and the like. Moreover, Ni and Au plating (in one embodiment, only the lands are plated) may be used to form the plating layer, followed by formation of the solder surface. In an embodiment, the package pads 134 are exposed and plated with nickel or gold on top of the solder mask openings. The package pads provide contact points for electrical connection to external circuitry and connectors, such as a printed circuit board.

The embodiment of the present invention illustrated in FIG. 1 provides a structure in which the surfaces of the semiconductor die 114 not bonded to the thermally and/or electrically conductive substrate 110 or the die connectors 120 are encapsulated in the dielectric material. As illustrated in FIG. 1, the upper surface 117 of the IC die is covered by dielectric material 122 with the exception of the locations on which the die connectors 120 are positioned. Moreover, the die connectors are also encapsulated on their lateral sides (all sides except the sides bonded to the IC die and the conductive traces). Thus, high thermal loads are accommodated by the packages described herein.

Although FIG. 1 illustrates a single IC die, additional IC dies may be bonded to the thermally and/or electrically conductive substrate. In such packages, conductive traces are provided as a single routing layer or multiple routing layers as appropriate to the particular application. In some designs, electrical interconnections are provided between IC dies to provide additional functionality. One of ordinary skill in the art would recognize many variations, modifications, and alternatives.

Figure 2:
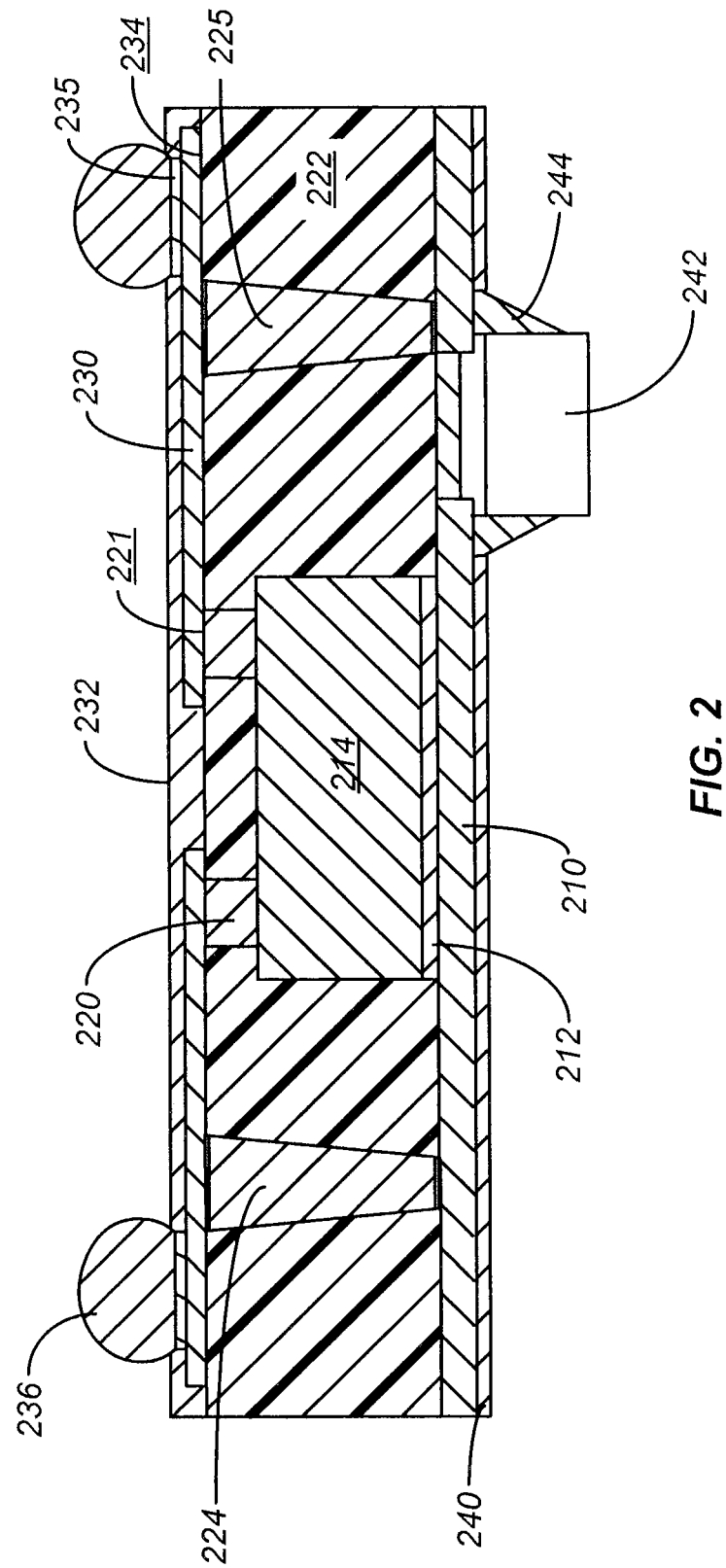
FIG. 2 is a simplified cross-sectional view of an integrated circuit package according to another embodiment of the present invention.

FIG. 2 is a simplified cross-sectional view of an integrated circuit package according to another embodiment of the present invention. As described more fully below, both thermal and electrical conductivity are provided by the illustrated package. For like portions of the package, reference may be made to the description provided with respect to FIG. 1. A semiconductor die 124, also referred to as an IC die, is bonded to a thermally and electrically conductive substrate 210 using a thermally conductive die attach material 212. A number of die connectors 220 are formed on an upper surface of the semiconductor die, providing for electrical connectivity to the integrated circuits present on the IC die. The die connectors 220 are formed at the wafer level. Die singulation or sawing is performed to separate the individual dies. Subsequently, the dies are attached on the thermally and electrically conductive substrate 210 as shown in FIG. 2. After formation of the die connectors, the IC die and die connectors are encapsulated using dielectric material 222. As described in reference to FIG. 3, the vertical thickness of the dielectric material 222 is greater than the sum of the die attach material 212, the IC die 214, and the die connectors 220, thereby covering the entirety of the die connectors extending above the IC die surface.

A grinding process is used to remove a portion of the dielectric material and expose a surface of the die connectors and form a routing surface 234. In the embodiment illustrated in FIG. 2, the grinding process planarizes the surface of the dielectric material 222, resulting in a surface comprising dielectric material and an exposed surface 221 of the die connectors. Vias 224 and 225 are formed in the dielectric material, passing from the routing surface 234 to the thermally and electrically conductive substrate 210. The vias 224 and 225 are filled with a conductive material, for example, copper or tungsten, to provide, in a specific application, via plugs for grounding of a portion of the thermally and electrically conductive substrate. As illustrated in FIG. 2, a via 225 to the right of the IC die provides a conductive path for additional electrical signals, such as power, $V_{CC}$, and the like. Conductive traces 230 are formed on the routing layer as described above.

In the package illustrated in FIG. 2, the conductive traces 230 are capable of providing conductive paths to/from the die connectors 220 as well as the vias plugs filling vias 224 and 225. A metal plating layer 232 is plated onto the upper surface of the routing layer 234 and conductive traces 230 and is shown as a solder mask. Ni and Au plating (in one embodiment, only the lands are plated) may be used followed by formation of the solder surface. Package pins 236, for example, solder balls, may be used to provide mechanical and electrical connectivity from the package connectors 235 of the IC die package to other components, including printed circuit boards. Multiple routing layers are provided in alternative embodiments. The package is mounted, for example, to a BGA, with the routing surface adjacent the BGA.

A chip capacitor 242 is mounted on the thermally and electrically conductive substrate 210 to provide electrical functionality. Other passive or active components are utilized in alternative embodiments. As will be evident to one of skill in the art, a view of the package from the side on which the chip capacitor 242 is mounted, will be a two-dimensional pattern, with the portion of the thermally and electrically conductive substrate to the left of the chip capacitor electrically isolated from the portion of the thermally and electrically conductive substrate to the right of the chip capacitor. A solder layer 240 or other plated layer is formed on the lower surface of the thermally and electrically conductive substrate 210 as appropriate for bonding of the package. As discussed in relation to the package illustrated in FIG. 1, multiple IC dies may be mounted on a thermally and electrically conductive substrate as appropriate to the particular applications. As illustrated in FIG. 2, solder 244 or other suitable material are utilized to provide mechanical support for the connection between the chip capacitor 242 and the electrically conductive substrate 210.

Figure 3:
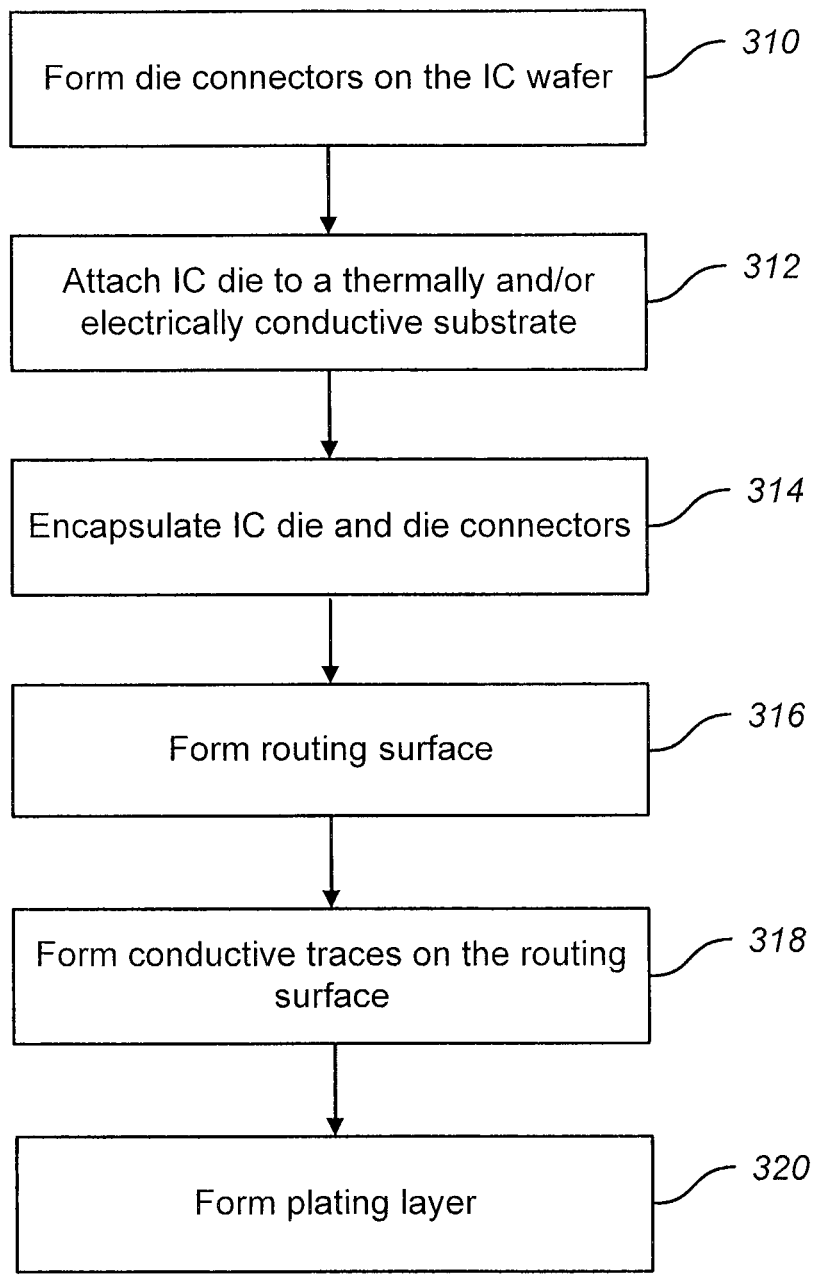
FIG. 3 is a simplified flowchart illustrating a method of manufacturing an integrated circuit package according to an embodiment of the present invention.

FIG. 3 is a simplified flowchart illustrating a method of manufacturing an integrated circuit according to an embodiment of the present invention. The method includes forming die connectors on a surface of the IC wafer (310). In some embodiments, a semiconductor wafer is copper, gold, or solder bumped prior to performing a backgrinding and singulation process to form a number of IC dies. The method also includes attaching a singulated IC die to a thermally and/or electrically conductive substrate (312). The IC die and the die connectors are encapsulated in a dielectric material (314). In embodiments of the present invention, the encapsulant covers the IC die and the die connectors on all exposed surfaces. A portion of the encapsulant is removed using a grinding or lapping process to form a routing surface (316). The routing surface is planar in some embodiments and comprises regions of dielectric material with planar surfaces of the die connectors disposed in the dielectric material as islands. Conductive traces are formed on the routing surface (318) and a plating layer is plated on the conductive traces and routing layer (320) to protect the conductive traces and provide heat spreading functionality, among other benefits.

The above sequence of steps provides a method for packaging an IC die in a package with enhanced thermal performance according to an embodiment of the present invention. As shown, the method uses a combination of steps including a way of encapsulating an IC die in an encapsulant material and forming a routing layer with exposed die connectors according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 4A:
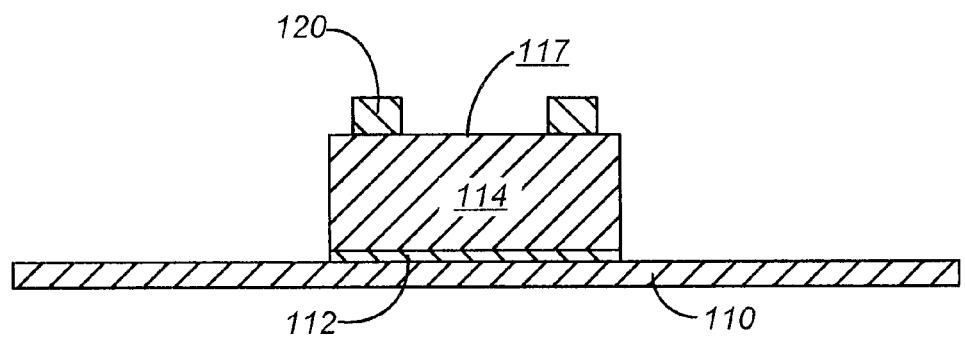
FIGS. 4A-4E are simplified cross-sectional views of a package during various stages of manufacturing according to an embodiment of the present invention.
Figure 4B:
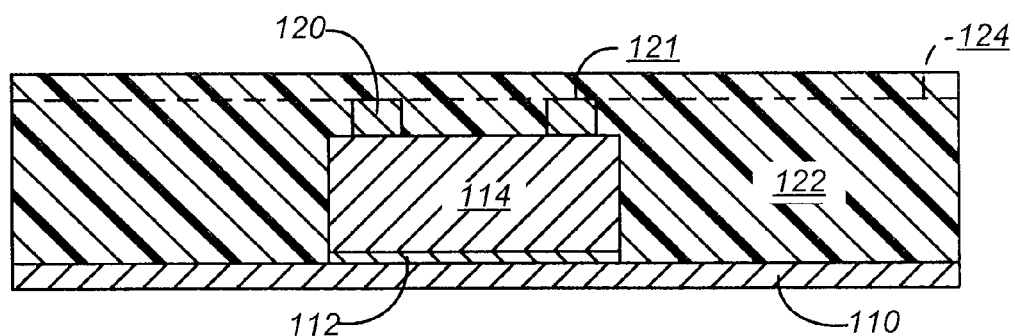

FIGS. 4A-4E are simplified cross-sectional views of a package during various stages of manufacturing according to an embodiment of the present invention. As illustrated in FIG. 4A, an IC die 114 is bonded to an thermally and/or electrically conductive substrate 110 using a thermally conductive die attach material 112. As illustrated in FIG. 4B, die connectors 120 are formed on the top surface 117 of the IC die 114 using a copper, gold, solder, or other bumping process. The die connectors 120 are formed at the wafer level. Die singulation or sawing is performed to separate the individual dies. Subsequently, the dies are attached on the thermally and/or electrically conductive substrate 110 as shown in FIG. 4A.

The IC die 114 and the die connectors 120 are encapsulated in a dielectric material 122 that completely encapsulates the IC die as well as the die connectors as shown in FIG. 4B. In order to expose the upper surface 121 of the die connectors, a portion of the encapsulant material, for example, a dielectric material, is removed above dashed line 124. A grinding or lapping process may be used to remove the portion of the encapsulant material, forming a planar routing surface aligned with dashed line 124. The upper surfaces 121 of the die connectors 120 are exposed while the remainder of the die connectors and the IC die are encapsulated and surrounded on their lateral sides.

Figure 4C:
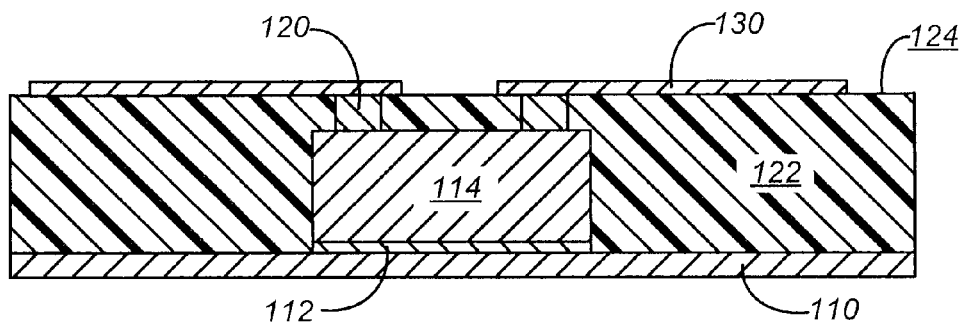

Referring to FIG. 4C, conductive traces 130 are formed on the routing surface 124. The conductive traces provide electrical connections between the integrated circuits present in the IC die and other electrical components, e.g., printed circuit boards. Although the conductive traces 130 are illustrated in a single cross-sectional view in FIG. 4C, one of ordinary skill in the art will appreciate that the conductive traces are patterned in a two dimensional pattern when viewed from a top-view. As discussed above, in some embodiments, multiple layers of conductive traces, separated by insulating layers and joined by conductive elements, are utilized to form multi-level interconnects as appropriate to a particular application.

Figure 4D:
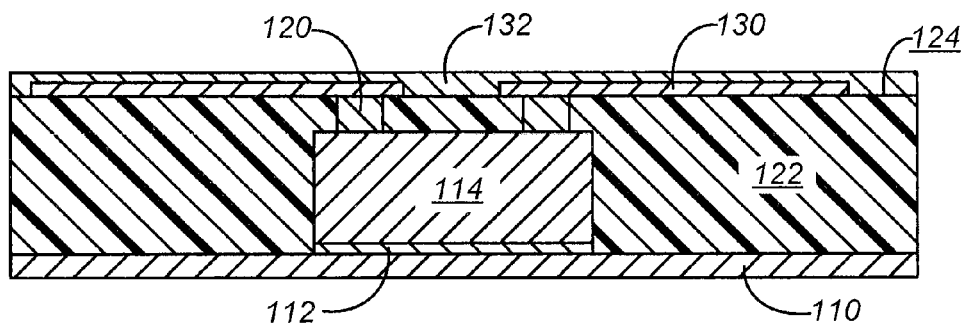
Figure 4E:
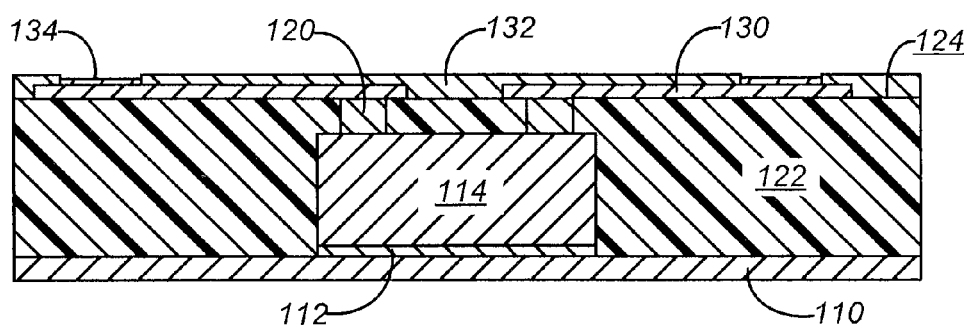

Referring to FIG. 4D, a plating layer 132, for example, solder, is plated on the conductive traces 130 and routing layer 124 to protect the conductive traces and provide heat spreading functionality. Package connectors 134 are formed in electrical contact with the conductive traces 130 as shown in FIG. 4E. In an alternative embodiment, the formation of the plating layer and the package connectors is performed in such a matter as to result in the structure shown in FIG. 4E, enabling the removal of the process illustrated in FIG. 4D.

The above process flow provides a method for packaging an IC die in a package with enhanced thermal performance according to an embodiment of the present invention. As shown, the process flow uses a combination of processing steps including a way of encapsulating an IC die in an encapsulant material and forming a routing layer with exposed die connectors according to an embodiment of the present invention. Other alternatives can also be provided where processing steps are added, one or more processing steps are removed, or one or more processing steps are provided in a different sequence without departing from the scope of the claims herein. Further details of the illustrated process flow can be found throughout the present specification and more particularly below.

Figure 5A:
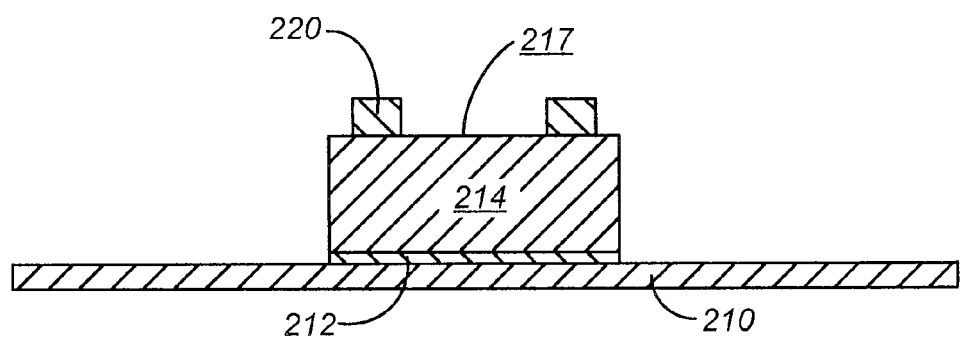
FIGS. 5A-5E are simplified cross-sectional views of a package during various stages of manufacturing according to another embodiment of the present invention.

FIGS. 5A-5E are simplified cross-sectional views of a package during various stages of manufacturing according to another embodiment of the present invention. As illustrated in FIG. 5A, an IC die 214 with die connectors 220 is bonded to a thermally and electrically conductive substrate 210 using a thermally conductive die attach material 212. Die connectors 220 are formed on the top surface 217 of the IC die 214 using a copper, gold, solder, or other bumping process. The die connectors 220 are formed at the wafer level. Die singulation or sawing is performed to separate the individual dies. Subsequently, the dies are attached on the thermally and electrically conductive substrate 210 as shown in FIG. 5A.

Figure 5B:
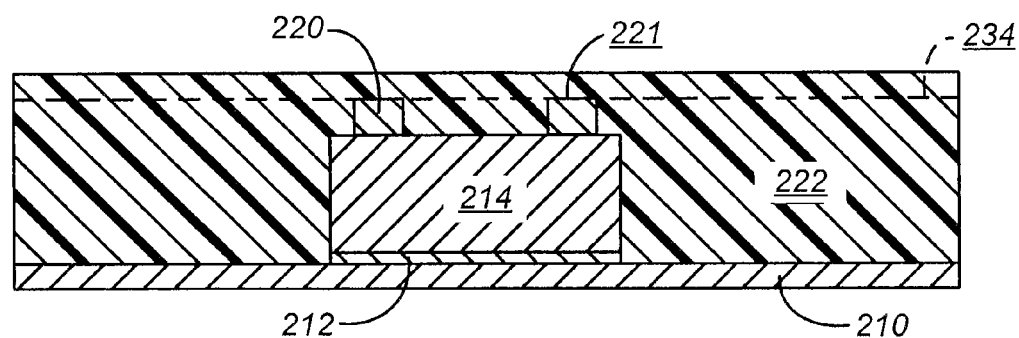

The IC die 214 and the die connectors 220 are encapsulated in a dielectric material 222 that completely encapsulates the IC die as well as the die connectors as shown in FIG. 5B. In order to expose the upper surface 221 of the die connectors, a portion of the encapsulant material, for example, a dielectric material, is removed above dashed line 234. A grinding or lapping process may be used to remove the portion of the encapsulant material, forming a planar routing surface aligned with dashed line 234. The upper surfaces 221 of the die connectors 220 are exposed while the remainder of the die connectors and the IC die are encapsulated and surrounded on their lateral sides.

Figure 5C:
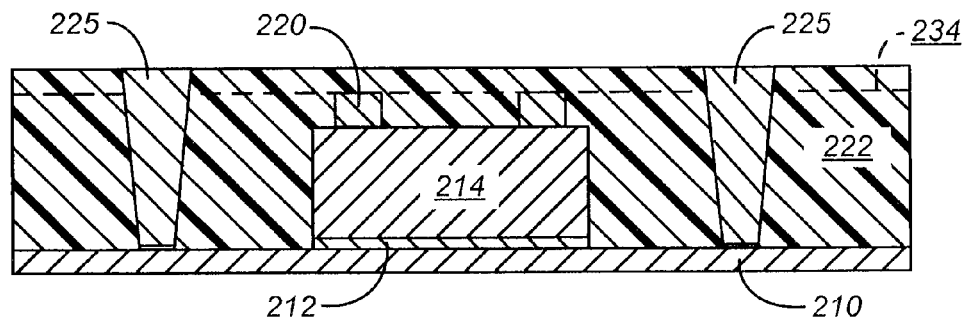

Referring to FIG. 5C, vias 224 and 225 are formed in the dielectric material 222, passing from the routing surface 234 to the thermally and electrically conductive substrate 210. The vias 224 and 225 are filled with a conductive material, for example, copper or tungsten, to provide, in a specific application, via plugs for grounding of a portion of the thermally and electrically conductive substrate 210.

Figure 5D:
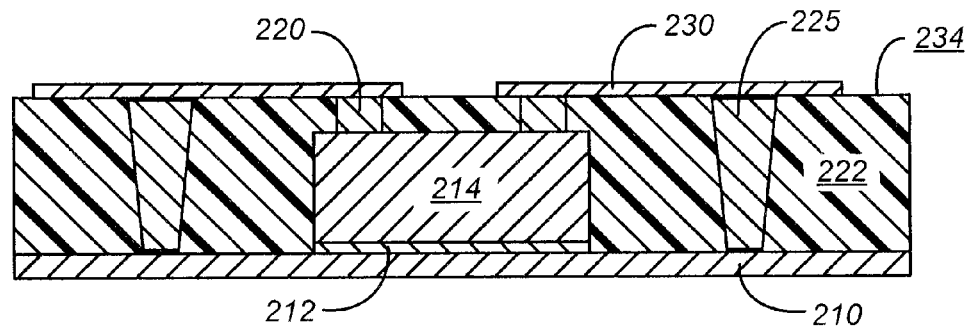

As illustrated in FIG. 5D, conductive traces 230 are formed on the routing layer as described above. The conductive traces provide electrical connections between the integrated circuits present in the IC die and other electrical components, e.g., printed circuit boards. As discussed above, in some embodiments, multiple layers of conductive traces, separated by insulating layers and joined by conductive elements, are utilized to form multi-level interconnects as appropriate to a particular application.

Figure 5E:
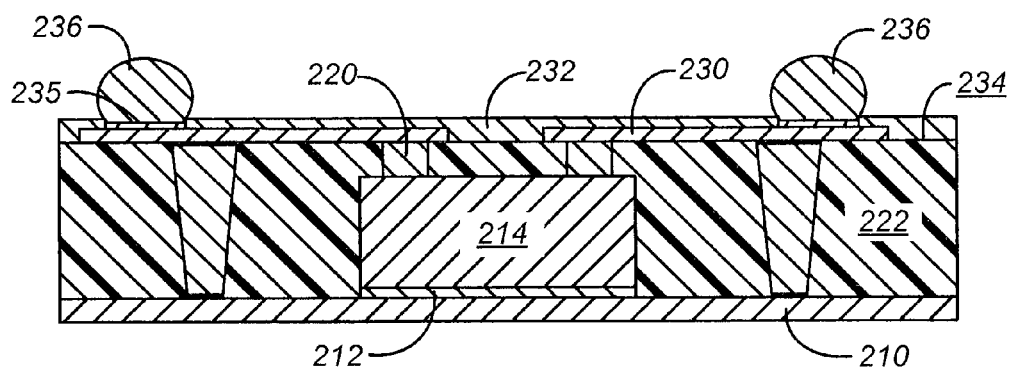

Referring to FIG. 5E, a plating layer 232, for example, solder, is plated on the conductive traces 230 and routing layer 234 to protect the conductive traces and provide heat spreading functionality, among other functions. Merely by way of example, the solder mask or plating layer 232 defines package connector lands and protects the electrically conductive traces 230 at the package connector side of the package. Moreover, the solder mask or plating layer 232 defines components, such as chip capacitors, connection lands at the lower side of the package. Package connectors 235 are formed in electrical contact with the conductive traces 230. Package pins 236, for example, solder balls, are bonded to the package connectors 235 to provide mechanical and electrical connectivity from the package connectors 235 and die pads (not shown) of the IC die package to other components, including printed circuit boards.

A chip capacitor, such as the one illustrated in FIG. 2 is mounted on a lower surface of the thermally and electrically conductive substrate 210 in some embodiments. Additional plating layers and other process steps are utilized to form the package illustrated in FIG. 2 in other embodiments. One of ordinary skill in the art would recognize many variations, modifications, and alternatives.

The above process flow provides a method for packaging an IC die in a package with enhanced thermal performance according to an embodiment of the present invention. As shown, the process flow uses a combination of processing steps including a way of encapsulating an IC die in an encapsulant material, forming vias, and forming a routing layer with exposed die connectors according to an embodiment of the present invention. Other alternatives can also be provided where processing steps are added, one or more processing steps are removed, or one or more processing steps are provided in a different sequence without departing from the scope of the claims herein. Further details of the illustrated process flow can be found throughout the present specification and more particularly below.

Figure 6:
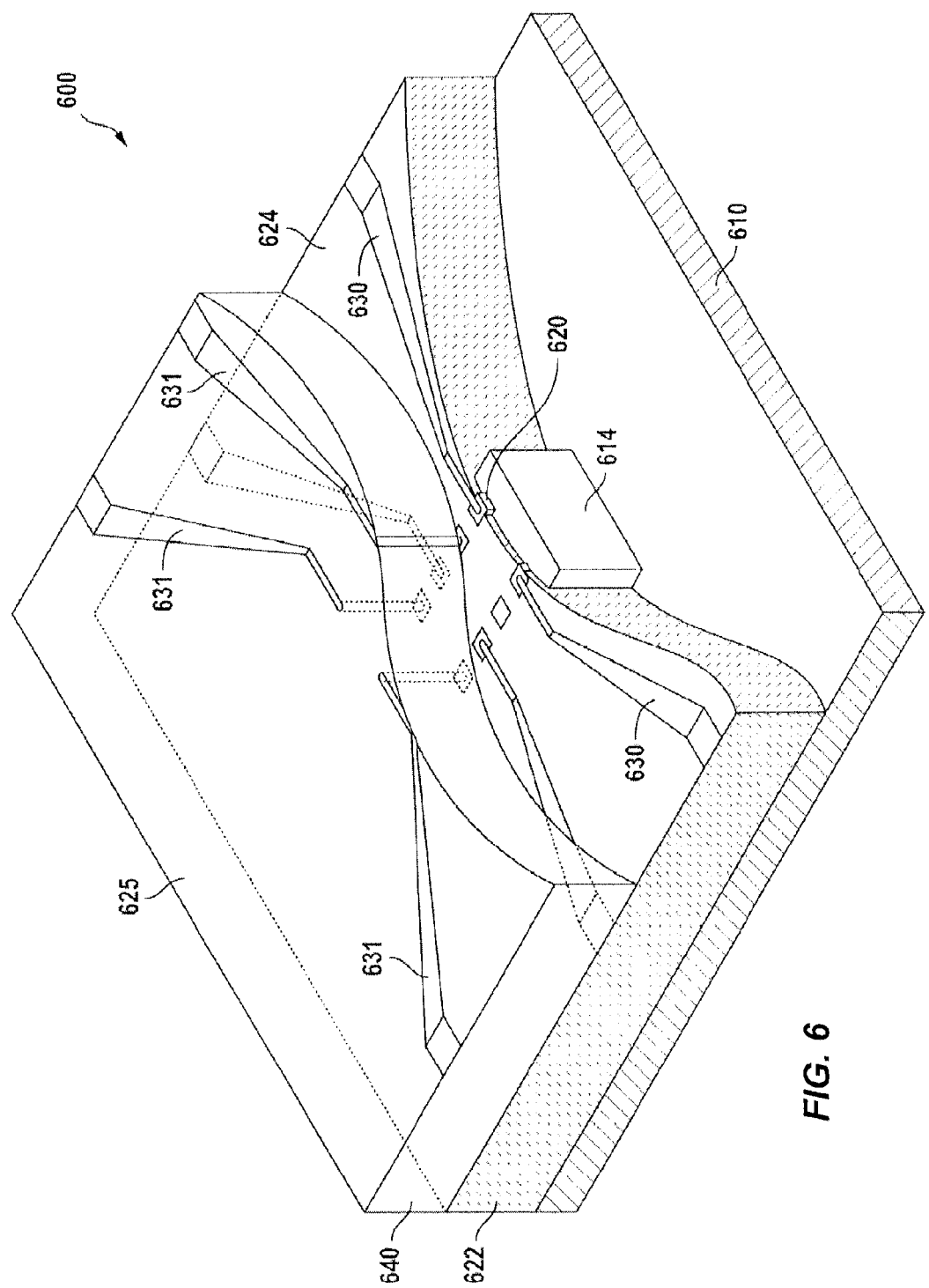
FIG. 6 is a simplified perspective view of a package with multi-layer routing according to an embodiment of the present invention.

FIG. 6 is a simplified perspective view of a package with multi-layer routing 600 according to an embodiment of the present invention. As illustrated in FIG. 6, multiple layers of conductive traces, separated by insulating layers and joined by conductive elements, are utilized to form multi-level interconnects. The use of multi-layer routing enables signals and power to be routed from the IC dies to connections on the package with a higher density than generally provided by single-layer routing designs. Vias that extend vertically through insulating layers are utilized according to embodiments of the present invention to connect conductive traces on various levels to other conductive traces and package connectors at the peripheral portions of the package.

Referring to FIG. 6, IC die 614 includes a number of die connectors 620 formed on the top surface of the IC die 614 using a copper, gold, solder, or other bumping process. Merely by way of example, for purposes of clarity, eight die connectors 620 are illustrated although other numbers of connectors are included within the scope of the present invention. As discussed above, the die connectors 620 are formed at the wafer level. Die singulation or sawing is performed to separate the individual dies. Subsequently, the dies are attached on the thermally and/or electrically conductive substrate 610 as shown in FIG. 6.

The IC die 614 and the die connectors 620 are encapsulated in a dielectric material 622 that completely encapsulates the IC die 614 as well as the lateral sides of the die connectors. A number of conductive traces 630 are formed on routing surface 624. The conductive traces 630 provide electrical connections between the integrated circuits present in the IC die 614 and other electrical components, e.g., printed circuit boards. As shown in FIG. 6, the conductive traces 630 are patterned in a two dimensional pattern to decrease the density of traces from a first density at the IC die 614 to a second lower density at peripheral portions of the thermally and/or electrically conductive substrate 610. The four conductive traces 630 provided at the first routing layer of the package with multi-layer routing represent first-layer routing. Of course, the number and geometry of the first-layer routing will depend on the particular applications.

The first layer of conductive traces 630 on routing surface 624 are electrically insulated from a second layer of conductive traces 631 on routing surface 625 by insulating layer 640. Vias (not shown) are utilized in an embodiment to provide electrical connectivity between the conductive traces 630 and package connectors provided on routing surface 625. A variety of dielectric materials may be used to form insulating layer 640. One of ordinary skill in the art would recognize many variations, modifications, and alternatives. The upper surface of the electrical insulating layer 640 provides a second routing surface 625 upon which the second layer of conductive traces 631 are formed. As shown in FIG. 6, three conductive traces 631 represent second-layer routing. Of course, the number and geometry of the second-layer routing will depend on the particular applications.

Although FIG. 6 illustrates a package utilizing dual-layer routing, embodiments of the present invention are not limited to two routing layers and additional routing layers (e.g., three or more) are included within the scope of the present invention. One of ordinary skill in the art would recognize many variations, modifications, and alternatives. A plating layer (not shown), for example, solder, is plated on the upper layer of conductive traces 631 and routing layer 625 to protect the conductive traces and provide heat spreading functionality. As discussed in relation to FIGS. 1 and 2, package connectors are formed in electrical contact with the conductive traces 630 and 631, utilizing vias as appropriate, to provide multi-layer electrical interconnections.

Figure 7:
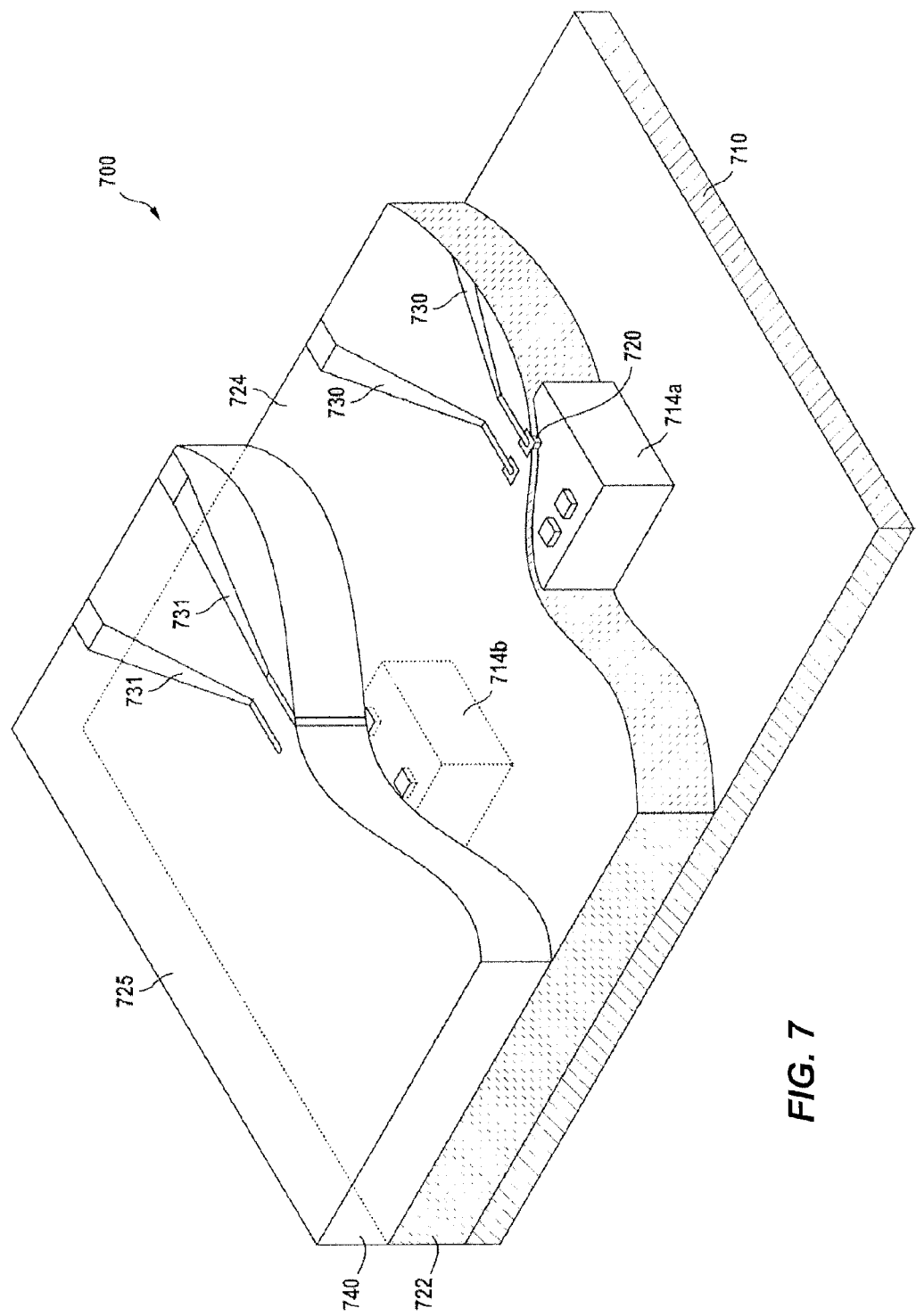
FIG. 7 is a simplified perspective view of a multi-die package according to an embodiment of the present invention.

FIG. 7 is a simplified perspective view of a multi-die package 700 according to an embodiment of the present invention. Two IC dies 714a and 714b are mounted on thermally and/or electrically conductive substrate 710. Although the two IC dies 714a and 714b are illustrated as attached to the substrate at the same vertical height, this is not required by the present invention, as the dies may be positioned at different vertical heights as appropriate to the particular application. Moreover, although two IC dies 714a and 714b are illustrated, additional IC dies may be utilized according to embodiments of the present invention. One of ordinary skill in the art would recognize many variations, modifications, and alternatives.

IC dies 714a and 714b include a number of die connectors 720 formed on the top surface of the IC dies 714a and 714b using a copper, gold, solder, or other bumping process. Merely by way of example, for purposes of clarity, four and two die connectors 720 are illustrated on IC dies 714a and 714b, respectively, although other numbers of die connectors are included within the scope of the present invention. As discussed previously, the die connectors 720 are formed at the wafer level. Die singulation or sawing is performed to separate the individual dies. Subsequently, the dies are attached on the thermally and/or electrically conductive substrate 710 in predetermined positions.

The IC dies 714a and 714b and the die connectors 720 are encapsulated in a dielectric material 722 that completely encapsulates the IC dies 714a and 714b as well as the lateral sides of the die connectors. A first number of conductive traces 730 are formed on routing surface 724. The conductive traces 730 provide electrical connections between the integrated circuits present in the IC dies 714a and 714b and other electrical components, e.g., printed circuit boards, and the like. As shown in FIG. 7, the conductive traces 730 are patterned in a two dimensional pattern to decrease the density of traces as a function of position on the thermally and/or electrically conductive substrate 710. The first number of conductive traces 730 provided on routing layer 724 represent first-layer routing in the multi-die package 700. Of course, the number and geometry of the first-layer routing will depend on the particular applications.

As shown in FIG. 7, conductive traces 730 provide for electrical connectivity on the first routing layer from the individual dies to connection areas near the periphery of the thermally and/or electrically conductive substrate 710. Additionally, conductive traces 730 may provide for electrical connectivity between the dies contained in the multi-die package 700. Thus, electrical connections may be provided for power and signals between IC die 714a, IC die 714b, and other IC dies (not shown).

The first layer of conductive traces 730 on routing surface 724 are electrically insulated from a second layer of conductive traces 731 on routing surface 725 by insulating layer 740. A variety of dielectric materials may be used to form insulating layer 740. The upper surface of the electrical insulating layer 740 provides a second routing surface 725 upon which the second layer of conductive traces 731 are formed. For purposes of simplicity, the multi-die package 700 illustrated in FIG. 7 features the first layer of conductive traces 730 utilized in conjunction with IC die 714a and the second layer of conductive traces 731 utilized in conjunction with IC die 714b. As will be understood, conductive traces on either the first layer, the second layer, or other layers may be utilized in conjunction with any or all of the IC dies included in the multi-die package 700. Of course, the number of conductive traces on each of the routing layers will depend on the particular applications. As shown in FIG. 7, two conductive traces 731 represent the second-layer routing. Of course, the number and geometry of the second-layer conductive traces will depend on the particular applications.

Although FIG. 7 illustrates a package utilizing dual-layer routing, additional routing layers are included within the scope of the present invention. One of ordinary skill in the art would recognize many variations, modifications, and alternatives. A plating layer (not shown), for example, solder, is plated on the upper layer of conductive traces 731 and routing layer 725 to protect the conductive traces and provide heat spreading functionality. Package connectors 734 are formed in electrical contact with the conductive traces 730 and 731, utilizing vias as appropriate to provide multi-layer electrical interconnections.

Figure 8A:
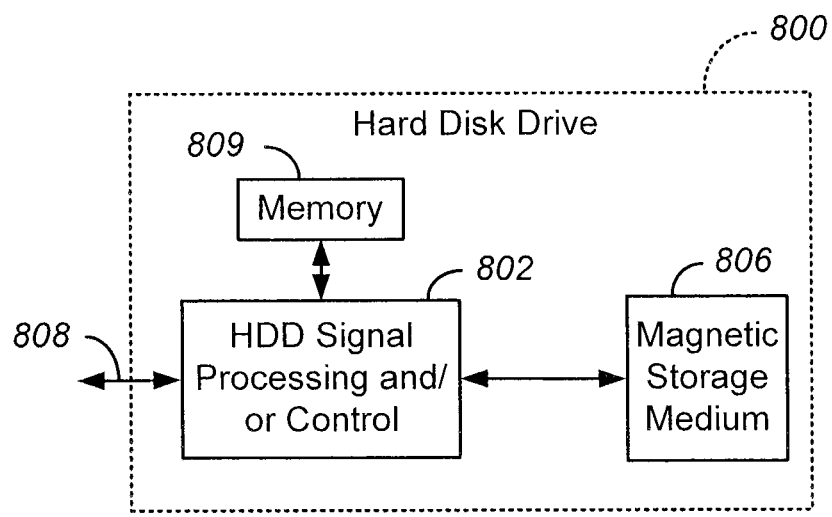
FIGS. 8A-8H show various devices in which the present invention may be embodied.

Referring now to FIGS. 8A-8G, various exemplary implementations of the present invention are shown. Referring to FIG. 8A, the present invention may be embodied in a hard disk drive 800. The present invention may implement either or both signal processing and/or control circuits, which are generally identified in FIG. 8A at 802. In some implementations, signal processing and/or control circuit 802 and/or other circuits (not shown) in HDD 800 may process data, perform coding and/or encryption, perform calculations, and/or format data that is output to and/or received from a magnetic storage medium 806.

HDD 800 may communicate with a host device (not shown) such as a computer, mobile computing devices such as personal digital assistants, cellular phones, media or MP3 players and the like, and/or other devices via one or more wired or wireless communication links 808. HDD 800 may be connected to memory 809, such as random access memory (RAM), a low latency nonvolatile memory such as flash memory, read only memory (ROM) and/or other suitable electronic data storage.

Figure 8B:
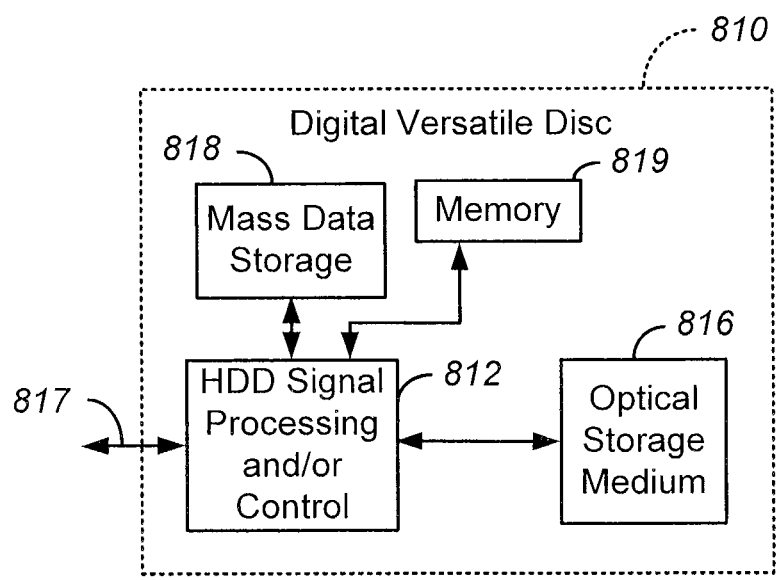

Referring now to FIG. 8B, the present invention may be embodied in a digital versatile disc (DVD) drive 810. The present invention may implement either or both signal processing and/or control circuits, which are generally identified in FIG. 8B at 812, and/or mass data storage 1018 of DVD drive 810. Signal processing and/or control circuit 812 and/or other circuits (not shown) in DVD 810 may process data, perform coding and/or encryption, perform calculations, and/or format data that is read from and/or data written to an optical storage medium 816. In some implementations, signal processing and/or control circuit 812 and/or other circuits (not shown) in DVD 810 can also perform other functions such as encoding and/or decoding and/or any other signal processing functions associated with a DVD drive.

DVD drive 810 may communicate with an output device (not shown) such as a computer, television or other device via one or more wired or wireless communication links 817. DVD 810 may communicate with mass data storage 818 that stores data in a nonvolatile manner. Mass data storage 818 may include a hard disk drive (HDD) such as that shown in FIG. 8A. The HDD may be a mini HDD that includes one or more platters having a diameter that is smaller than approximately 1.8". DVD 810 may be connected to memory 819, such as RAM, ROM, low latency nonvolatile memory such as flash memory, and/or other suitable electronic data storage.

Figure 8C:
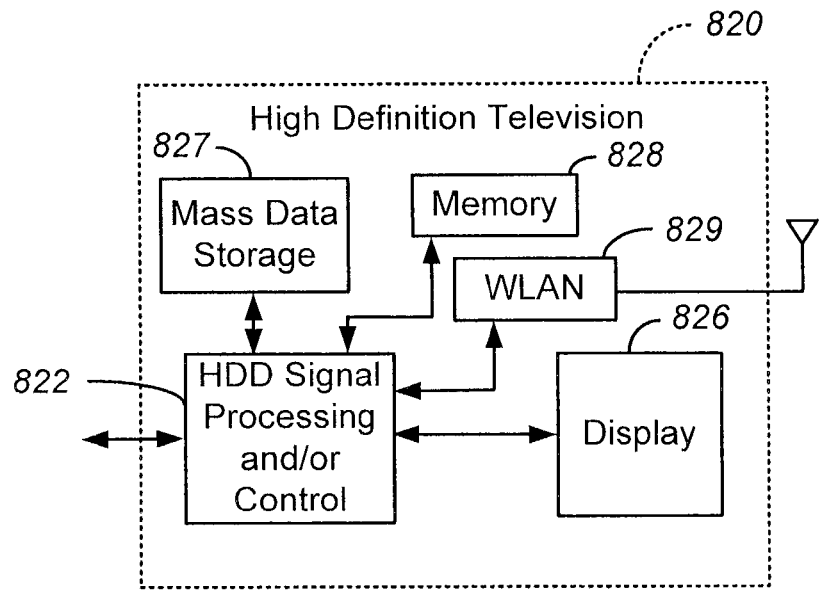

Referring now to FIG. 8C, the present invention may be embodied in a high definition television (HDTV) 820. The present invention may implement either or both signal processing and/or control circuits, which are generally identified in FIG. 8C at 822, a WLAN interface and/or mass data storage of the HDTV 820. HDTV 820 receives HDTV input signals in either a wired or wireless format and generates HDTV output signals for a display 826. In some implementations, signal processing circuit and/or control circuit 822 and/or other circuits (not shown) of HDTV 820 may process data, perform coding and/or encryption, perform calculations, format data and/or perform any other type of HDTV processing that may be required.

HDTV 820 may communicate with mass data storage 827 that stores data in a nonvolatile manner such as optical and/or magnetic storage devices. At least one HDD may have the configuration shown in FIG. 8A and/or at least one DVD may have the configuration shown in FIG. 8B. The HDD may be a mini HDD that includes one or more platters having a diameter that is smaller than approximately 1.8". HDTV 820 may be connected to memory 828 such as RAM, ROM, low latency nonvolatile memory such as flash memory and/or other suitable electronic data storage. HDTV 820 also may support connections with a WLAN via a WLAN network interface 829.

Figure 8D:
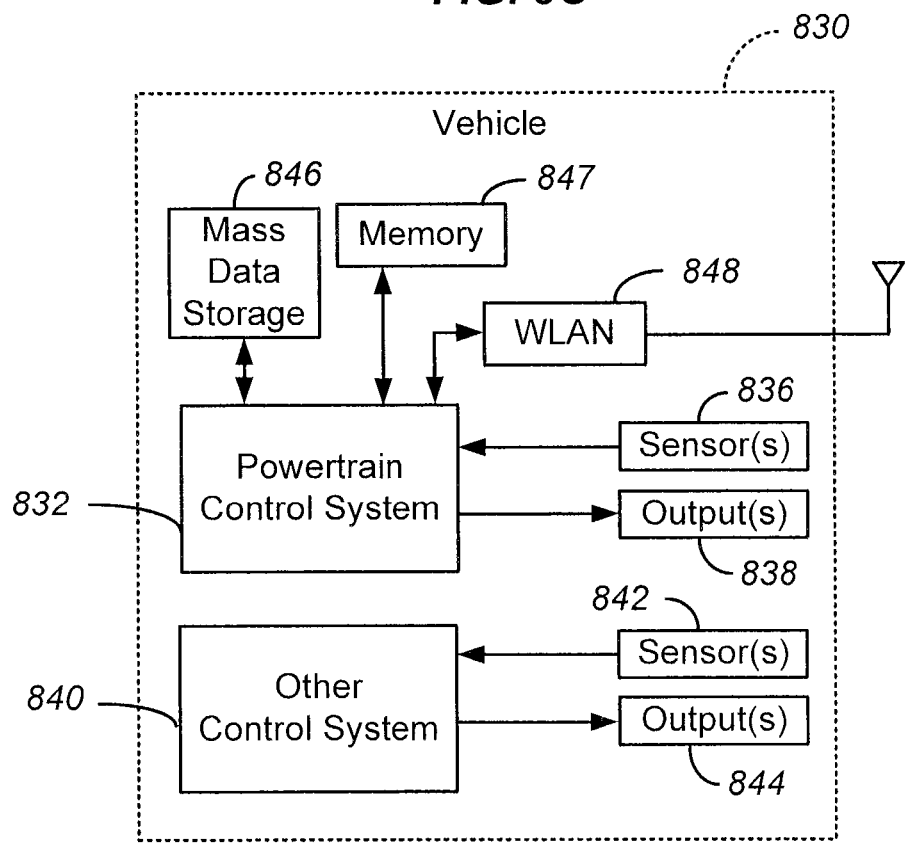

Referring now to FIG. 8D, the present invention implements a control system of a vehicle 830, a WLAN interface and/or mass data storage of the vehicle control system. In some implementations, the present invention implements a powertrain control system 832 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 840 of vehicle 830. Control system 840 may likewise receive signals from input sensors 842 and/or output control signals to one or more output devices 844. In some implementations, control system 840 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 832 may communicate with mass data storage 846 that stores data in a nonvolatile manner. Mass data storage 846 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". Powertrain control system 832 may be connected to memory 847 such as RAM, ROM, low latency nonvolatile memory such as flash memory and/or other suitable electronic data storage. Powertrain control system 832 also may support connections with a WLAN via a WLAN network interface 848. The control system 840 may also include mass data storage, memory and/or a WLAN interface (all not shown).

Figure 8E:
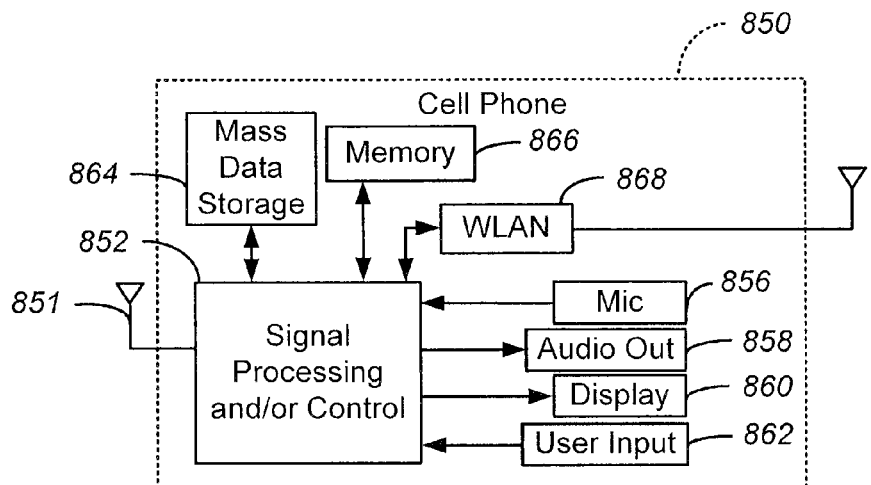

Referring now to FIG. 8E, the present invention may be embodied in a cellular phone 850 that may include a cellular antenna 851. The present invention may implement either or both signal processing and/or control circuits, which are generally identified in FIG. 8E at 852, a WLAN interface and/or mass data storage of the cellular phone 850. In some implementations, cellular phone 850 includes a microphone 856, an audio output 858 such as a speaker and/or audio output jack, a display 860 and/or an input device 862 such as a keypad, pointing device, voice actuation and/or other input device. Signal processing and/or control circuits 852 and/or other circuits (not shown) in cellular phone 850 may process data, perform coding and/or encryption, perform calculations, format data and/or perform other cellular phone functions.

Cellular phone 850 may communicate with mass data storage 864 that stores data in a nonvolatile manner such as optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". Cellular phone 850 may be connected to memory 866 such as RAM, ROM, low latency nonvolatile memory such as flash memory and/or other suitable electronic data storage. Cellular phone 850 also may support connections with a WLAN via a WLAN network interface 868.

Figure 8F:
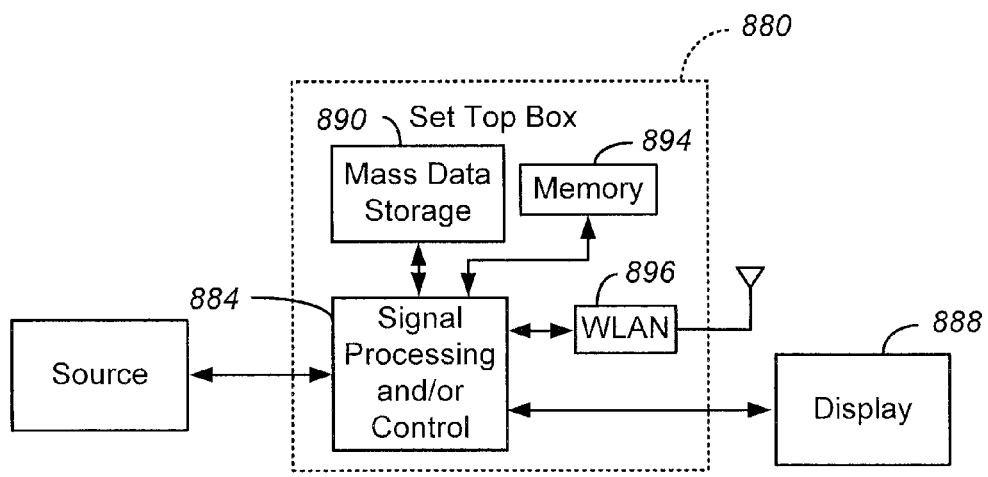

Referring now to FIG. 8F, the present invention may be embodied in a set top box 880. The present invention may implement either or both signal processing and/or control circuits, which are generally identified in FIG. 8F at 884, a WLAN interface and/or mass data storage of the set top box 880. Set top box 880 receives signals from a source such as a broadband source and outputs standard and/or high definition audio/video signals suitable for a display 888 such as a television and/or monitor and/or other video and/or audio output devices. Signal processing and/or control circuits 884 and/or other circuits (not shown) of the set top box 880 may process data, perform coding and/or encryption, perform calculations, format data and/or perform any other set top box function.

Set top box 880 may communicate with mass data storage 890 that stores data in a nonvolatile manner. Mass data storage 890 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". Set top box 880 may be connected to memory 894 such as RAM, ROM, low latency nonvolatile memory such as flash memory and/or other suitable electronic data storage. Set top box 880 also may support connections with a WLAN via a WLAN network interface 896.

Figure 8G:
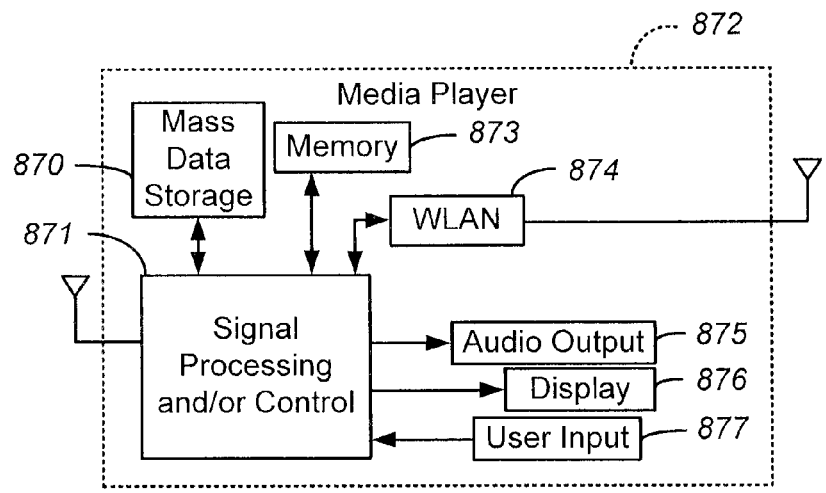

Referring now to FIG. 8G, the present invention may be embodied in a media player 872. The present invention may implement either or both signal processing and/or control circuits, which are generally identified in FIG. 8G at 871, a WLAN interface and/or mass data storage of the media player 872. In some implementations, media player 872 includes a display 876 and/or a user input 877 such as a keypad, touchpad and the like. In some implementations, media player 872 may employ a graphical user interface (GUI) that typically employs menus, drop down menus, icons and/or a point-and-click interface via display 876 and/or user input 877. Media player 872 further includes an audio output 875 such as a speaker and/or audio output jack. Signal processing and/or control circuits 871 and/or other circuits (not shown) of media player 872 may process data, perform coding and/or encryption, perform calculations, format data and/or perform any other media player function.

Media player 872 may communicate with mass data storage 870 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". Media player 872 may be connected to memory 873 such as RAM, ROM, low latency nonvolatile memory such as flash memory and/or other suitable electronic data storage. Media player 872 also may support connections with a WLAN via a WLAN network interface 874.

Figure 8H:
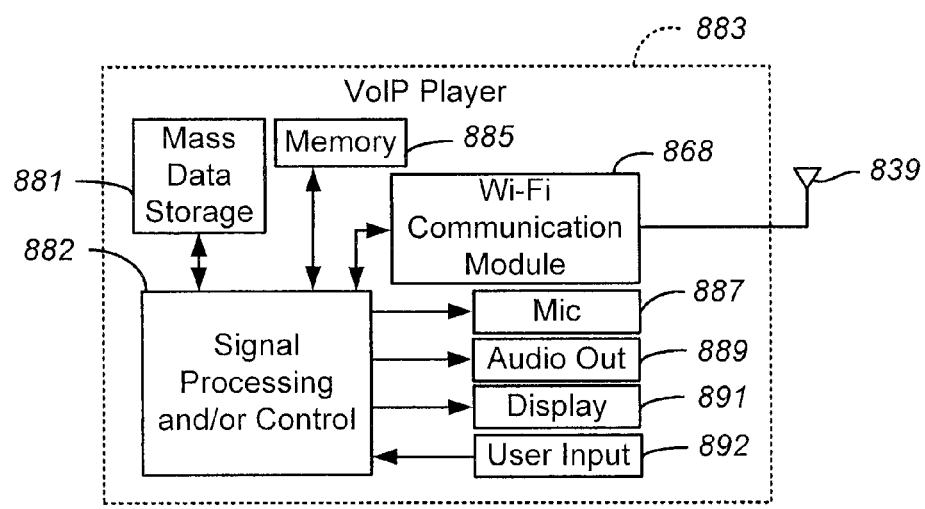

Referring to FIG. 8H, the present invention may be embodied in a Voice over Internet Protocol (VoIP) phone 883 that may include an antenna 839. The present invention may implement either or both signal processing and/or control circuits, which are generally identified in FIG. 8H at 882, a wireless interface and/or mass data storage of the VoIP phone 883. In some implementations, VoIP phone 883 includes, in part, a microphone 887, an audio output 889 such as a speaker and/or audio output jack, a display monitor 891, an input device 892 such as a keypad, pointing device, voice actuation and/or other input devices, and a Wireless Fidelity (Wi-Fi) communication module 886. Signal processing and/or control circuits 882 and/or other circuits (not shown) in VoIP phone 883 may process data, perform coding and/or encryption, perform calculations, format data and/or perform other VoIP phone functions.

VoIP phone 883 may communicate with mass data storage 502 that stores data in a nonvolatile manner such as optical and/or magnetic storage devices, for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". VoIP phone 883 may be connected to memory 885, which may be a RAM, ROM, low latency nonvolatile memory such as flash memory and/or other suitable electronic data storage. VoIP phone 883 is configured to establish communications link with a VoIP network (not shown) via Wi-Fi communication module 886. Still other implementations in addition to those described above are contemplated.

The above embodiments of the present invention are illustrative and not limitative. Various alternatives and equivalents are possible. The invention is not limited by the type of comparator, counter, pulse-width modulator, driver, or filter used. The invention is not limited by the type of amplifier used to establish the reference charging and discharging currents. The invention is not limited by the of oscillator. The invention is not limited by the type of integrated circuit in which the present disclosure may be disposed. Nor is the invention limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A method of manufacturing an integrated circuit package, the method comprising:
attaching a first surface of a die to a conductive substrate, the die having at least one side surface that is not the first surface;
forming a plurality of die connectors on a second surface of the die, the second surface opposing the first surface;
encapsulating the at least one side surface of the die, the plurality of die connectors and at least a portion of the second surface of the die with an encapsulant material;
planarizing an area of the encapsulant material over the encapsulated plurality of die connectors to expose a surface of at least one die connector;
forming a first-level conductive trace on the planarized area of the encapsulant material to contact an exposed die connector, the first-level conductive trace contacting the exposed die connector to allow electrical communication;
forming an insulating layer over the planarized area; and
forming at least one second-level conductive trace on the insulating layer to be in communication with a die connector via a communication channel through the insulating layer,
wherein the at least one second-level conductive trace is insulated from the first-level conductive trace.

2. The method of claim 1, wherein the planarizing of the encapsulant material is terminated prior to exposing the encapsulated portion of the second surface of the die.

3. The method of claim 1, wherein the first-level conductive trace contacts the exposed die connector to allow electrical communication between the exposed die connector and a package connector.

4. The method of claim 1, wherein planarizing an area of the encapsulant material comprises grinding an exposed area of the encapsulant material.

5. The method of claim 1, wherein the encapsulant material comprises a dielectric material.

6. The method of claim 1, wherein the insulating layer insulates the second-level conductive trace from the first-level conductive trace.

7. The method of claim 1, wherein the encapsulant material comprises a single continuously disposed unitary material.

8. The method of claim 1, further comprising:
forming at least one via passing from the planarized area of the encapsulant material to the first-level conductive substrate, the at least one via adapted to be in electrical communication with a voltage.

9. The method of claim 1, further comprising:
forming at least one via passing through the insulating layer to connect at least one first-layer conductive trace with at least one second-level conductive trace.

10. A method of manufacturing an integrated circuit package, the method comprising:
attaching a first surface of a die to a conductive substrate, the die having at least one side surface that is not the first surface;
forming a plurality of die connectors on a second surface of the die, the second surface opposing the first surface;
encapsulating the die and the plurality of die connectors in an encapsulant material, wherein the encapsulant material is in contact all along the at least one side surface of the die, planarizing an area of the encapsulant material over the encapsulated plurality of die connectors to expose a surface of at least one die connector,
forming a first-level conductive trace on the planarized area of the encapsulant material to contact an exposed die connector, the first-level conductive trace contacting the exposed die connector to allow electrical communication;
forming an insulating layer over the planarized area, and
forming at least one second-level conductive trace on the insulating layer to be in communication with a die connector via a communication channel through the insulating layer,
wherein the at least one second-level conductive trace is insulated from the first-level conductive trace.

11. The method of claim 10, wherein the planarizing of the encapsulant material is terminated prior to exposing the encapsulated portion of the second surface of the die.

12. The method of claim 10, wherein the first-level conductive trace contacts the exposed die connector to allow electrical communication between the exposed die connector and a package connector.

13. The method of claim 10, wherein planarizing an area of the encapsulant material comprises grinding an exposed area of the encapsulant material.

14. The method of claim 10, wherein the encapsulant material comprises a dielectric material.

15. The method of claim 10, wherein the insulating layer insulates the second-level conductive trace from the first-level conductive trace.

16. The method of claim 10, wherein the encapsulant material comprises a single continuously disposed unitary material.

17. The method of claim 10, further comprising:
forming at least one via passing from the planarized area of the encapsulant material to the first-level conductive substrate, the at least one via adapted to be in electrical communication with a voltage.

18. The method of claim 10, further comprising:
forming at least one via passing through the insulating layer to connect at least one first-layer conductive trace with at least one second-level conductive trace.

19. A method of manufacturing an integrated circuit package, the method comprising:
attaching a first surface of each die of a plurality of dies to a conductive substrate, each die of the plurality of dies having a second surface opposite the first surface, and at least one side surface that is not the first surface;
forming a plurality of die connectors on the second surface of each die of the plurality of dies;
encapsulating each die and the plurality of die connectors formed on the second surface of each die with an encapsulant material;
planarizing an area of the encapsulant material over the encapsulated plurality of die connectors for each die to expose a surface of at least one die connector on each die;
forming a first-level conductive trace on the planarized area of the encapsulant material to contact an exposed die connector on each die, the first-level conductive trace contacting the exposed die connector to allow electrical communication;
forming an insulating layer over the planarized area; and
forming at least one second-level conductive trace on the insulating layer to be in communication with at least one die connector on each die via a communication channel through the insulating layer,
wherein the at least one second-level conductive trace is insulated from the first-level conductive trace.

20. The method of claim 19, further comprising:
forming at least one via passing from the planarized area of the encapsulant material to the first-level conductive substrate, the at least one via adapted to be in electrical communication with a voltage.

21. The method of claim 19, further comprising:
forming at least one via passing through the insulating layer to connect at least one first-layer conductive trace with at least one second-level conductive trace.

* * * * *